(12) United States Patent
Su et al.

(10) Patent No.: US 7,704,415 B2
(45) Date of Patent: Apr. 27, 2010

(54) COMPOSITE MATERIAL WITH ELECTRON-DONATING AND ELECTRON-ACCEPTING PROPERTY, METHOD FOR FORMING THE SAME, AND THEIR APPLICATION

(75) Inventors: Wei-Fang Su, Taipei (TW); Chi-An Dai, Taipei (TW); Chun-Chih Ho, Taichung (TW)

(73) Assignee: National Taiwan University, Taipei (TW)

( * ) Notice: Subject to any disclaimer, the term of this patent is extended or adjusted under 35 U.S.C. 154(b) by 1128 days.

(21) Appl. No.: 11/298,464

(22) Filed: Dec. 12, 2005

(65) Prior Publication Data

US 2006/0266982 A1 Nov. 30, 2006

(30) Foreign Application Priority Data

May 27, 2005 (TW) ............................... 94117499 A

(51) Int. Cl.
*H01B 1/20* (2006.01)
(52) U.S. Cl. ...................... 252/500; 252/511; 252/510; 252/299.01; 252/301.16; 428/403; 136/263; 430/20; 430/270.1; 977/932; 977/948
(58) Field of Classification Search ................ 252/500, 252/510, 511, 299.61; 438/88, 99; 257/40; 437/1; 136/243–265; 429/213, 303–304; 977/811, 825, 742, 773, 776–777
See application file for complete search history.

(56) References Cited

U.S. PATENT DOCUMENTS 6,294,401 B1 * 9/2001 Jacobson et al. ............... 438/99

6,512,172 B1 * 1/2003 Salafsky et al. ............. 136/263
2004/0242792 A1 * 12/2004 Sotzing ................... 525/326.1

OTHER PUBLICATIONS

Greenham et al, "Charge separation and transport in conjugated polymer/cadmium-selenide nanocrystal composites studied by photoluminescence quenching and photoconductivity," Syn. Metal, 1997, V84, pp. 545-546.*
Kim et al, "Nanopartcle-induced phase transitions in diblock-copolymer films," Adv. Matl. 2005, 17, 2618-2622.*
Glass et al, "Block Copolymer micelle nanolithoghraphy," Nanotechnology, 2003, V14, pp. 1153-1160.*
Sohn et al,"Perpendicular lamelle induced at the interface of neutral self-assembled monolayers in thin diblock copolymer films," Polymer, 2002, V-43, pp. 2507-2512.*

* cited by examiner

*Primary Examiner*—Stanley Silverman
*Assistant Examiner*—Kallambella Vijayakumar
(74) *Attorney, Agent, or Firm*—WPAT, PC; Justin King

(57) ABSTRACT

The present invention discloses a composite material with electron-donating and electron-accepting property is disclosed, wherein the composite material comprises a plurality of nanoparticles with electron-accepting property, a plurality of diblock copolymers, and a bi-continuous structure. Each diblock copolymer comprises a first polymer chain with electron-donating property and a second polymer chain connected with the mentioned nanoparticles. Additionally, the bi-continuous structure containing a first domain and a second domain, wherein the bi-continuous structure is self-assembled from the diblock copolymers, wherein the first polymer chain is in the first domain, and the second polymer chain and the plurality of nanoparticles are in the second domain. Furthermore, this invention also discloses methods for forming the composite material and their applications.

48 Claims, 2 Drawing Sheets

Diblock copolymer

COMPOSITE MATERIAL WITH ELECTRON-DONATING AND ELECTRON-ACCEPTING PROPERTY, METHOD FOR FORMING THE SAME, AND THEIR APPLICATION

GOVERNMENT INTERESTS

The invention described and claimed herein was made in part utilizing funds supplied by the United States Air Force under contract NO. FA5209-04-P-0500 AOARD 04-23 between the United States Air Force and the National Taiwan University. The government has certain rights to the invention.

BACKGROUND OF THE INVENTION

1. Field of the Invention

The present invention is generally related to composite materials, and more particularly to composite materials with electron-donating and electron-accepting property, their forming method, and application in photovoltaic devices.

2. Description of the Prior Art

In conventional solid-state solar cells, electron-hole pairs are created by light absorption in a semiconductor, with charge separation and collection accomplished under the influence of electric fields within the semiconductor. However, extensive usage of inorganic photovoltaic devices is limited due to the high costs by the fabrication procedures involving elevated temperature, high vacuum, and numerous lithographic steps. The development of new types of photovoltaic devices has been a growing attention owing to the public awareness of the shortage and running out of Earth's oil reserve.

Large-area thin-film photovoltaic devices based on conjugated polymer are of great interest in the last couple of years, because the availability of a soluble semiconductor not only opened the way towards cheaper processing via numerous coating methods, but also made it possible to investigate blends with other semiconductors while maintaining the advantages of solution processing. Mechanical flexibility and low weight of polymer materials make them more attractive for photovoltaic applications although devices fabricated based on conjugated polymer have been found to have low conversion efficiencies.

At present, the nanoparticle/polymer composites for photovoltaic devices are prepared by blending semiconducting nanoparticles with conducting polymers in solvent. The nanoparticles are randomly distributed in the polymer matrix. In order for the nanoparticles in the polymer matrix to form a highly connected network, usually the nanoparticles have to be in high concentration. A coagulation problem of the composites often occurs from high concentration of nanoparticles and reduces the interfacial actions between the polymer and nanoparticle that results in a decreased in the quantum efficiency. Therefore, new composite materials are still needed to eliminate coagulation problem, to increase interfacial actions between nanoparticle and polymer, and to be fabricated into high efficiency photovoltaic devices.

SUMMARY OF THE INVENTION

In accordance with the present invention, new composite materials with electron-donating and electron-accepting property and their forming method are provided in corresponding to both economic effect and utilization in industry One object of the present invention is to employ diblock copolymers to self-assemble a bi-continuous structure, wherein one domain of the bi-continuous structure is electron-donating by one block of the copolymer, and the other domain is electron-accepting by incorporating nanoparticles connected to the other block of the copolymer. Therefore, charge carrier (holes and electrons) can travel along separated pathways in the composite material to their respective electrodes.

Another object of the present invention is to provide larger interface area between electron-donating materials and electron-accepting materials for effective charge separation by the bi-continuous structure. Therefore, this present invention does have the economic advantages for industrial applications.

Accordingly, the present invention discloses a composite material with electron-donating and electron-accepting property is disclosed, wherein the composite material comprises a plurality of nanoparticles with electron-accepting property, a plurality of diblock copolymers, and a bi-continuous structure. Each diblock copolymer comprises a first polymer chain with electron-donating property and a second polymer chain connected with the mentioned nanoparticles. Additionally, the bi-continuous structure containing a first domain and a second domain, wherein the bi-continuous structure is self-assembled from the diblock copolymers, wherein the first polymer chain is in the first domain, and the second polymer chain and the plurality of nanoparticles are in the second domain. Furthermore, this invention also discloses methods for forming the composite material and their applications.

DESCRIPTION OF THE PREFERRED EMBODIMENTS

Figure 1:
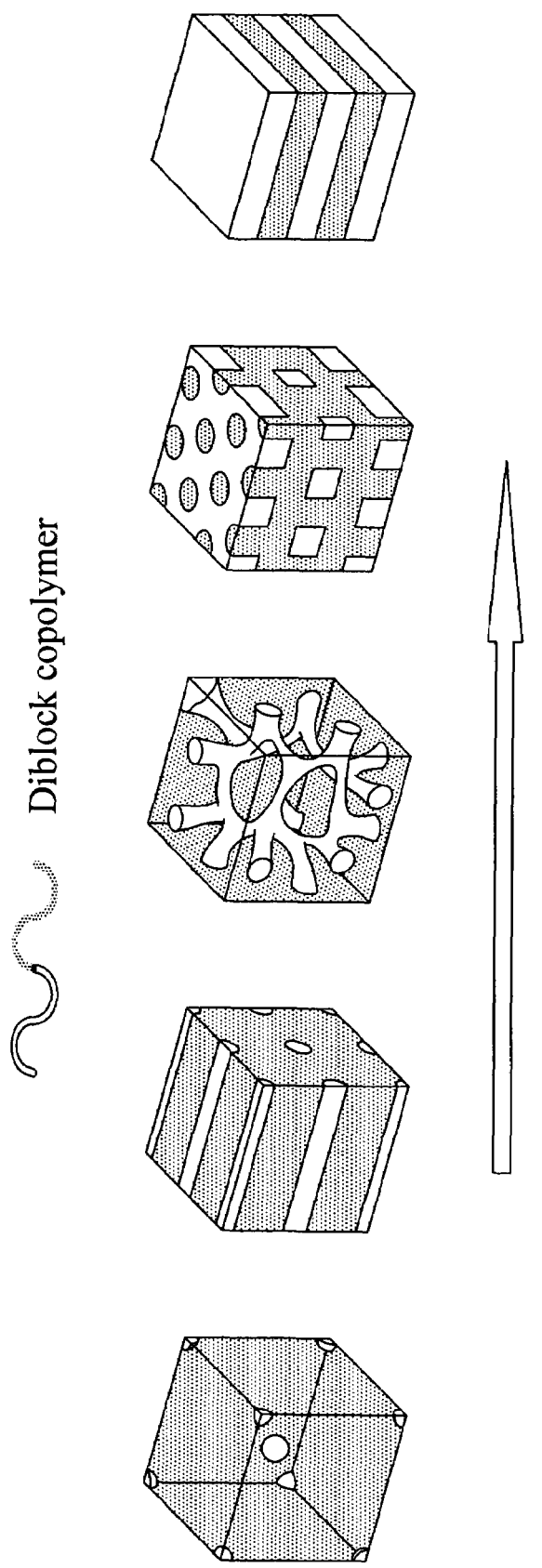
FIG. 1 shows effect of varying composition on the ordered-structure, wherein the direction of the arrow means increasing volume fraction of one polymer chain (white segment)

What probed into the invention are composite material with electron-donating and electron-accepting property, their forming method, and their application. Detailed descriptions of the production, structure and elements will be provided in the following in order to make the invention thoroughly understood. Obviously, the application of the invention is not confined to specific details familiar to those who are skilled in the art. On the other hand, the common elements and procedures that are known to everyone are not described in details to avoid unnecessary limits of the invention. Some preferred embodiments of the present invention will now be described in greater detail in the following. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

Definitions

The term "nanoparticle" herein refers to metal nanoparticle or inorganic particles or mixture of metal and inorganic nanoparticles. The size of nanoparticles is less than 100 nm in diameter. Furthermore, the nanoparticles used herein are colloidal, which refers to the fact that the nanoparticles are dispersed within a continuous medium in a manner that prevents them from being filtered easily or settled rapidly.

The term "connect" herein refers to describe the relationship between the second polymer chain and the nanoparticles. The nanoparticles are positioned nearby the second polymer chain through chemical or physical interaction (e.g. covalent bond, coordination bond, van der Waals force, hydrogen bond, etc.).

In a first embodiment of the present invention, a composite material with electron-donating and electron-accepting property is disclosed, wherein the composite material comprises a plurality of nanoparticles with electron-accepting property, a plurality of diblock copolymers, and a bi-continuous structure. Each diblock copolymer comprises a first polymer chain with electron-donating property and a second polymer chain connected with the mentioned nanoparticles. Additionally, the bi-continuous structure containing a first domain and a second domain, wherein the bi-continuous structure is self-assembled from the diblock copolymers, wherein the first polymer chain is in the first domain, and the second polymer chain and the plurality of nanoparticles are in the second domain.

In this embodiment, the material of the nanoparticles is inorganic or metal (e.g. gold, silver, or platinum) or a mixture of metal and inorganic, and thermal stable nanoparticles is preferred. The material of the inorganic nanoparticles comprises one of the group consisting of: $TiO_2$, CdS, CdSe, GaAs, GaP, ZnO, $Fe_2O_3$, $SnO_2$, SiC, InN, InGaN, GaN, PbS, $Bi_2S_3$, Cu-In-Ga-Se and Cu-In-Ga-S. Furthermore, the inorganic nanoparticles can comprise more than 2 materials, for example: 1) the inorganic nanoparticles comprises $TiO_2$ and at least one II-VI semiconductor; 2) the inorganic nanoparticles comprises $TiO_2$ doped with at least one transition metal ion or Lanthanide ion; 3) inorganic nanoparticles comprises at least two oxide, wherein one oxide has low bandgap ($\leq 3.0$ eV) and the other oxide exhibits high conductivity ($\leq 100$ $\Omega$/sq). Moreover, the first polymer chain comprises one of the group consisting of: poly-paraphenylene (PPP), poly-p-phenylenevinylene (PPV), poly-thiophene (PT), poly-fluorene (PF), poly-pyrrole (PPy) and their derivatives, and more preferred, the first polymer chain can comprise heat-absorbing liquid crystalline ligand. Additionally the second polymer chain can comprise one of the group consisting of: poly(4-vinyl pyridine) (PVP), poly(2-vinyl pyridine), poly(vinyl alcohol), poly(acrylic acid) (PAA), poly(methylmethacrylate) (PMMA), poly(ethylene oxide) (PEO), polystyrene sulfonic acid (PSSA), poly hydroxyl styrene (PSOH), and poly (ethylene glycol) (PEG).

In this embodiment, the connecting type between the second polymer chain and the nanoparticles is chemical bondings or physical bondings. Furthermore, the connecting type can be one of the group consisting of: covalent bond, coordination bond, van der Waals force, and hydrogen bond. The shape of the diblock copolymers is linear or comblike or starlike or dendritic.

Diblock copolymers can lead to a wide range of phase behaviors that directly influence the associated physical property and ultimate applications. FIG. 1 shows effect of varying composition on the ordered-structure, wherein the direction of the arrow means increasing volume fraction of one polymer chain (white segment). In this invention, bi-continuous structure is a preferred ordered-structure, so as to provide charge carrier (holes and electrons) travel along separated pathways in the composite material to their respective electrodes. Therefore, the shape of the first domain and the second domain are independently selected from the group consisting of: substantially pillar-shaped, substantially laminate, substantially spiral, and substantially network-shaped.

In this embodiment, the composite material is membrane-shaped with a first surface and a second surface wherein the first surface is opposite to the second surface. When the membrane-shaped composite material is used in photovoltaic device, anode is connected to the first surface, and cathode is connected to the second surface. In the mentioned composite material, the first domain of the bi-continuous structure provides a substantially linear first pathway from the first surface to the second surface, and the first pathway is used for hole traveling to the first surface (anode direction). On the other hand, the second domain of the bi-continuous structure provides a substantially linear second pathway from the first surface to the second surface, and the second pathway is used for electron traveling to second surface (cathode direction). For the shortest pathway between two parallel surfaces is a straight line perpendicular to both surfaces, the most preferred length of the first pathway and the second pathway are substantially equal to the thickness of the membrane-shaped composite material.

Figure 2:
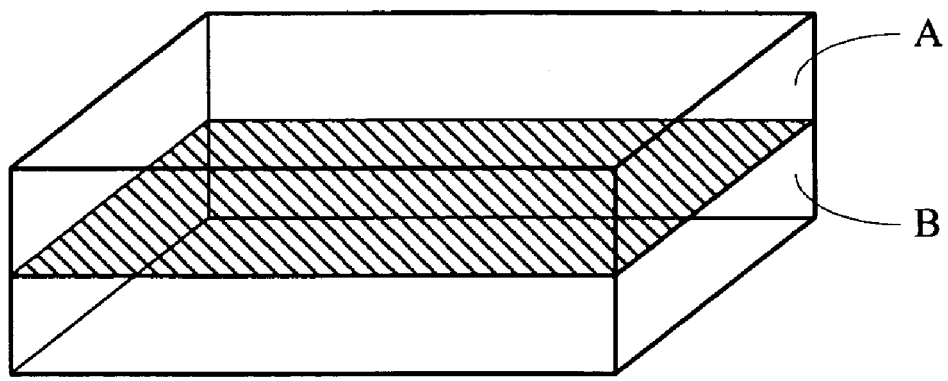
FIG. 2 is a three dimensional view exhibits a conventional flat junction of the solar cell according to prior art.
Figure 3:
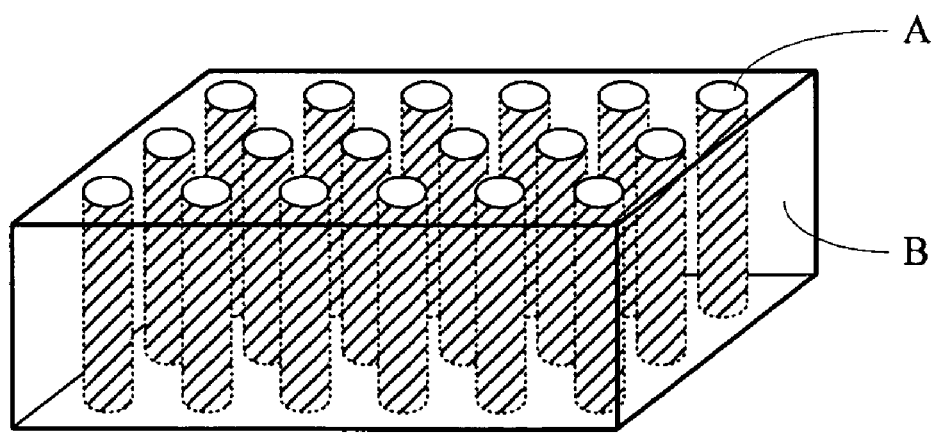
FIG. 3 is a three dimensional view exhibits a bulk heterojunction of the solar cell according to the first embodiment of the present invention.

A basic requirement for a photovoltaic material is photoconductivity; that is, generating a charge upon illumination. Subsequently, these charges must drift (under an applied electric field) toward electrodes for collection. The mechanisms which determine the performance of a photovoltaic device will involve the photo-electron generation rate, charge separation (electron-hole dissociation), and charge transport. In this invention, charge separation in the composite material is tremendously enhanced by increasing the interface area between electron-donating materials and electron-accepting materials. Referring to FIG. 2 and FIG. 3, A is electron-accepting material, and B is electron-donating material. One preferred example of the provided composite material, as shown in FIG. 3, exhibits bulk heterojunction with larger interfaces (area with oblique lines) for the solar cells comparing to conventional flat junction with smaller interfaces (prior art as shown in FIG. 2). Furthermore, the charge separation process must be fast compared to the radiative and non-radiative decays of the excitons, which typically occur with a time constant in the range of 100-1000 ps. The problem of transport of carriers to the electrodes without recombination is another important issue to solve, since it requires that once the electrons and holes are separated onto two different materials, each carrier has a pathway to the appropriate electrode. Therefore, as described in the previous section, the most preferred length of both pathways (for hole transporting and electron transporting) are substantially equal to the thickness of the membrane-shaped composite material.

In a second embodiment of the present invention, a method for fabricating the composite material as described in the first embodiment is disclosed. First, the diblock copolymer is provided, and then mixed with the nanoparticles to form a mixture. Next, the mixture is deposited onto a substrate to form a template (comprising the substrate and the mixture thereon). Finally, the template is annealed to form the composite material on the substrate.

In a third embodiment of the present invention, a method for fabricating the composite material as described in the first embodiment is disclosed. First, the diblock copolymer is provided, and then mixed with a precursor of the nanoparticles to form a mixture. Next, the mixture is deposited onto a substrate to form a template (comprising the substrate and the mixture thereon). Then, the template is annealed to form the bi-continuous structure. Finally, the precursor connected to the second polymer chain is reacted to form the nanoparticles, so as to form the composite material on the substrate.

In a fourth embodiment of the present invention, a method for fabricating the composite material as described in the first embodiment is disclosed. First, the diblock copolymer is provided, and then added into a solvent to form a solution with a micelle formed from the diblock copolymer. Next, the nanoparticles are added into the solution to form a mixture, wherein the nanoparticles are attracted by the second polymer chain of the micelle. In another example, the nanoparticles are repelled by the first polymer chain so that the nanoparticles will migrate toward the second polymer chain of the micelle. Afterwards, the mixture is deposited onto a substrate to form a template. Then, the template is annealed to form the composite material on the substrate.

In a fifth embodiment of the present invention, a method for fabricating the composite material as described in the first embodiment is disclosed. First, the diblock copolymer is provided, and then added into a solvent to form a solution with a micelle formed from the diblock copolymer. Next, a precursor of the nanoparticles is added into the solution to form a mixture, wherein the precursor is attracted by the second polymer chain of the micelle. In another example, the precursor is repelled by the first polymer chain so that the precursor will migrate toward the second polymer chain of the micelle. Afterwards, the mixture is deposited onto a substrate to form a template. Then, the template is annealed to form the bi-continuous structure. Finally, the precursor connected to the second polymer chain is reacted to form the nanoparticles, so as to form the composite material on the substrate.

EXAMPLE

Synthesis of Diblock Copolymer PPP-b-P4VP [Poly(Para Phenylene)-b-poly(4-vinyl pyridine)]

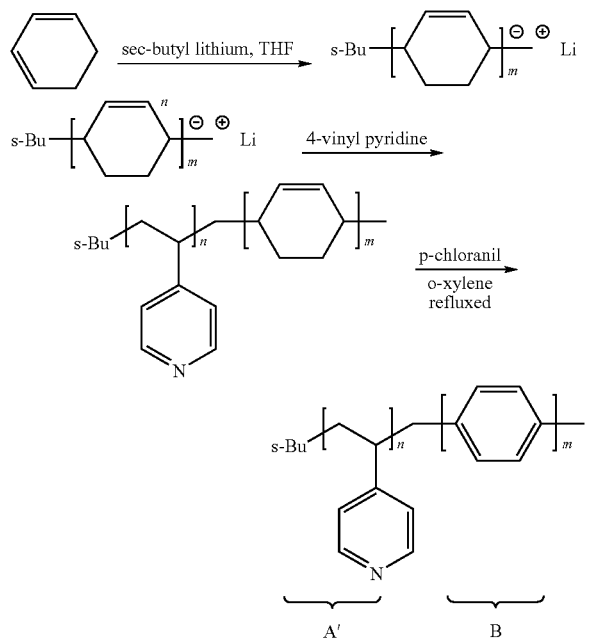

Scheme 1

As shown in scheme 1, 1,3-cyclohexane was added into dehydrated THF, and then the solution was cooled to -78° C.

The sec-butyl lithium (initiator) was subsequently added into the cooled solution, and then the cooled solution was stirred for 2 hours. Next, 4-vinyl pyridine was added to the mixture, and then the mixture was stirred for 1 hour. After completion of the reaction, the reaction mixture was quenched by methanol, and then concentrated and purified to get a intermediate PCHD-b-P4VP [Poly (1,3-cyclohexadiene)-b-Poly(4-vinyl pyridine)].

Afterwards, the intermediate PCHD-b-P4VP and p-chloranil were added into o-xylene, and then the mixture was refluxed (about 140° C.) for 15 hours. Finally, the reaction mixture was quenched by methanol, and then to get diblock copolymer PPP-b-P4VP. Referring to scheme 1, block PPP is the first polymer chain with electron-donating property, which is marked with B; block P4VP is the second polymer chain containing polar moiety to attract nanoparticles with electron-accepting property, which is marked with A'.

In situ synthesis of nanoparticles in the diblock copolymer PPP-b-P4VP (0.2 g) and $CdCl_2$ (0.1 g) were added into a solution consisting of THF (8 ml) and methoxy ethanol (4 ml), and then the mixture was stirred for 2 hours. After complete dissolution, the mixture was coated on a substrate by a spin-coater (2000 rmp). After the mixture was solidified, the coated substrate was placed in an oven, and then dried at 80° C. for 2 hours. Next, the coated substrate is treated at 110° C. and under 20 mtorr for 12 hours.

The treated substrate was then placed in a three-necked Schott pressure bottle. Next, $H_2S$ gas was purged into the bottle to in-situ synthesize CdS nanoparticle for 24 hours. After completion of the reaction, composite material comprising diblock copolymer PPP-b-P4VP and CdS nanoparticles connected to block P4VP was fabricated.

In this invention, there are two preferred procedures for forming diblock copolymers. One procedure is to synthesize the first polymer chain and the second chain separately, wherein both of the polymer chains contain end function groups. Then, the first polymer chain is connected with the second polymer chain by coupling their end functional groups. The other procedure is to synthesize one polymer chain first, and then to keep or to modify the polymer chain with function groups, so as to subsequently synthesize the other polymer chain from the function groups. Furthermore, if a long range structure self-assembled from the diblock copolymer is required, the molecular weight distribution of both polymer chains and their relative molar ratio should be controlled precisely. Therefore, anionic polymerization and living free radical polymerization are preferred to meet the requirements of narrow molecular weight distribution and exactly molecular weight.

One preferred example of this embodiment is to synthesize the second polymer chain by anionic polymerization and living free radical polymerization, and to synthesize the first polymer chain by step-growth polymerization. Moreover, besides the second polymer chain is designed with hydrophilic or polar moiety to attract nanoparticles, the first polymer chain can also be modified with hydrophilic or polar moiety to help the first polymer chain to be dissolved in solvents. However, it is noticed that the attraction between the second polymer chain and the nanoparticles is larger than that between the first polymer chain and the nanoparticles.

In a sixth embodiment of the present invention, a method for fabricating the composite material as described in the first embodiment is disclosed. First, the diblock copolymer is added into a solvent to form a solution. Next, the mixture is deposited onto a substrate to form a template. Then, the template is annealed to form the bi-continuous structure. After the depositing process, the nanoparticles are contacted with the bi-continuous structure, wherein the nanoparticles are attracted by the second polymer chain. In another example, the nanoparticles are repelled by the first polymer chain so that the nanoparticles will migrate toward the second polymer chain. Finally, the composite material is formed on the substrate.

In a seventh embodiment of the present invention, a method for fabricating the composite material as described in the first embodiment is disclosed. First, the diblock copolymer is added into a solvent to form a solution. Next, the mixture is deposited onto a substrate to form a template. Then, the template is annealed to form the bi-continuous structure. After the depositing process, a precursor of the nanoparticles is contacted with the bi-continuous structure, wherein the precursor is attracted by the second polymer chain. In another example, the precursor is repelled by the first polymer chain so that the precursor will migrate toward the second polymer chain. Finally, the precursor is reacted to form the nanoparticles, so as to form the composite material on the substrate.

In the above preferred embodiments, the present invention employ diblock copolymers to self-assemble a bi-continuous structure, wherein one domain of the bi-continuous structure is electron-donating by one block of the copolymer, and the other domain is electron-accepting by incorporating nanoparticles connected to the other block of the copolymer. Therefore, charge carrier (holes and electrons) can travel along separated pathways in the composite material to their respective electrodes. Additionally, the present invention provides larger interface area between electron-donating materials and electron-accepting materials for effective charge separation by the bi-continuous structure. Therefore, this present invention does have the economic advantages for industrial applications.

To sum up, the present invention discloses a composite material with electron-donating and electron-accepting property is disclosed, wherein the composite material comprises a plurality of nanoparticles with electron-accepting property, a plurality of diblock copolymers, and a bi-continuous structure. Each diblock copolymer comprises a first polymer chain with electron-donating property and a second polymer chain connected with the mentioned nanoparticles. Additionally, the bi-continuous structure containing a first domain and a second domain, wherein the bi-continuous structure is self-assembled from the diblock copolymers, wherein the first polymer chain is in the first domain, and the second polymer chain and the plurality of nanoparticles are in the second domain. Furthermore, this invention also discloses methods for forming the composite material and their applications.

Obviously many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:
1. A composite material with electron-donating and electron-accepting property, comprising
   a plurality of nanoparticles with electron-accepting property;
   a plurality of diblock copolymers, wherein each said diblock copolymer comprises a first polymer chain with electron-donating property and a second polymer chain connected with said nanoparticles; and
   a bi-continuous structure containing a first domain and a second domain, wherein said bi-continuous structure is self-assembled from said plurality of diblock copolymers, wherein said first polymer chain is in said first domain, and said second polymer chain and said plurality of nanoparticles are in said second domain.

2. The composite material as claimed in claim 1, wherein the material of said nanoparticles is inorganic or metal or a mixture of metal and inorganic.

3. The composite material as claimed in claim 2, wherein the inorganic nanoparticles is thermal stable.

4. The composite material as claimed in claim 2, wherein the material of said inorganic nanoparticles comprises at least one selected from the group consisting of TiO2, CdS, CdSe, GaAs, GaP, ZnO, Fe2O3, SnO2, SiC, InN, InGaN, GaN, PbS, Bi2S3, Cu—In—Ga—Se and Cu—In—Ga—S.

5. The composite material as claimed in claim 2, wherein the metal nanoparticles comprises at least one selected from the group consisting of gold, silver, and platinum.

6. The composite material as claimed in claim 1, wherein the connecting type between said second polymer chain and said nanoparticles is chemical bonding or physical bonding.

7. The composite material as claimed in claim 1, wherein the connecting type between said second polymer chain and said nanoparticles comprises one of the group consisting of covalent bond, coordination bond, van der Waals force, and hydrogen bond.

8. The composite material as claimed in claim 1, wherein said second polymer chain comprises at least one selected from the group consisting of poly(4-vinyl pyridine) (PVP), poly(2-vinyl pyridine), poly(vinyl alcohol), poly(acrylic acid) (PAA), poly(methylmethacrylate) (PMMA), poly(ethylene oxide) (PEO), polystyrene sulfonic acid (PSSA), poly hydroxyl styrene (PSOH), and poly(ethylene glycol) (PEG).

9. The composite material as claimed in claim 1, wherein the shape of said diblock copolymers is linear or comblike or starlike or dendritic.

10. The composite material as claimed in claim 1, wherein the shape of said first domain and said second domain are independently selected from the group consisting of substantially pillar-shaped, substantially laminate, substantially spiral, and substantially network- shaped.

11. The composite material as claimed in claim 1, wherein said composite material is membrane-shaped with a first surface and a second surface wherein said first surface is opposite to said second surface.

12. The composite material as claimed in claim 11, wherein said first domain provides a substantially linear first pathway from said first surface to said second surface, and said first pathway is used for hole traveling.

13. The composite material as claimed in claim 12, wherein the length of said first pathway is substantially equal to the thickness of said composite material.

14. The composite material as claimed in claim 11, wherein said second domain provides a substantially linear second pathway from said first surface to said second surface, and said second pathway is used for electron traveling.

15. The composite material as claimed in claim 14, wherein the length of the second pathway is substantially equal to the thickness of said composite material.

16. The composite material as claimed in claim 11, wherein said composite material is used as an active layer whose functions including light absorption, charge separation and charge transport of the photovoltaic device.

17. A composite material with electron-donating and electron-accepting property, comprising a plurality of nanoparticles with electron-accepting property, wherein said nanoparticles is inorganic or metal or a mixture of metal and inorganic, wherein said inorganic nanoparticles comprise one selected from the group consisting of (A) $TiO_2$ and at least one II-VI semiconductor, (B) $TiO_2$ doped with at least one transition metal ion or Lanthanide ion, (C) at least two oxides, wherein the bandgap of one oxide is equivalent to or less than 3.0 eV, and the sheet resistance of the other oxide is equivalent to or less than 100 $\Omega$/sq;

a plurality of diblock copolymers, wherein each said diblock copolymer comprises a first polymer chain with electron-donating property and a second polymer chain connected with said nanoparticles; and a bi-continuous structure containing a first domain and a second domain, wherein said bi-continuous structure is self-assembled from said plurality of diblock copolymers, wherein said first polymer chain is in said first domain, and said second polymer chain and said plurality of nanoparticles are in said second domain.

18. The composite material as claimed in claim 17, wherein the inorganic nanoparticles is thermal stable.

19. The composite material as claimed in claim 17, wherein the metal nanoparticles comprises at least one selected from the group consisting of gold, silver, and platinum.

20. The composite material as claimed in claim 17, wherein said first polymer chain comprises heat-absorbing liquid crystalline ligand.

21. The composite material as claimed in claim 17, wherein said first polymer chain comprises at least one selected from the group consisting of poly-paraphenylene (PPP), poly-p-phenylenevinylene (PPV), poly-thiophene (PT), poly-fluorene (PF), poly-pyrrole (PPy) and their derivatives.

22. The composite material as claimed in claim 17, wherein the connecting type between said second polymer chain and said nanoparticles is chemical bonding or physical bonding.

23. The composite material as claimed in claim 17, wherein the connecting type between said second polymer chain and said nanoparticles comprises at least one selected from the group consisting of covalent bond, coordination bond, van der Waals force, and hydrogen bond.

24. The composite material as claimed in claim 17, wherein said second polymer chain comprises at least one selected from the group consisting of poly(4-vinyl pyridine) (PVP), poly(2-vinyl pyridine), poly(vinyl alcohol), poly(acrylic acid) (PAA), poly(methylmethacrylate) (PMMA), poly(ethylene oxide) (PEO), polystyrene sulfonic acid (PSSA), poly hydroxyl styrene (PSOH), and poly(ethylene glycol) (PEG).

25. The composite material as claimed in claim 17, wherein the shape of said diblock copolymers is linear or comblike or starlike or dendritic.

26. The composite material as claimed in claim 17, wherein the shape of said first domain and said second domain are independently selected from the group consisting of substantially pillar-shaped, substantially laminate, substantially spiral, and substantially network-shaped.

27. The composite material as claimed in claim 17, wherein said composite material is membrane-shaped with a first surface and a second surface wherein said first surface is opposite to said second surface.

28. The composite material as claimed in claim 27, wherein said first domain provides a substantially linear first pathway from said first surface to said second surface, and said first pathway is used for hole traveling.

29. The composite material as claimed in claim 28, wherein the length of said first pathway is substantially equal to the thickness of said composite material.

30. The composite material as claimed in claim 27, wherein said second domain provides a substantially linear second pathway from said first surface to said second surface, and said second pathway is used for electron traveling.

31. The composite material as claimed in claim 30, wherein the length of the second pathway is substantially equal to the thickness of said composite material 32. The composite material as claimed in claim 27, wherein said composite material is used as an active layer whose functions including light absorption, charge separation and charge transport of the photovoltaic device.

33. A composite material with electron-donating and electron-accepting property, comprising a plurality of nanoparticles with electron-accepting property; a plurality of diblock copolymers, wherein each said diblock copolymer comprises a first polymer chain with electron-donating property and a second polymer chain connected with said nanoparticles, wherein (A) said first polymer chain comprises heat-absorbing liquid crystalline ligand, or (B) said first polymer chain comprise one selected from the group consisting of poly-paraphenylene (PPP), poly-p-phenylenevinylene (PPV), poly-thiophene (PT), poly-fluorene (PF), poly-pyrrole (PPy) and their derivatives; and a bi-continuous structure containing a first domain and a second domain, wherein said bi-continuous structure is self-assembled from said plurality of diblock copolymers, wherein said first polymer chain is in said first domain, and said second polymer chain and said plurality of nanoparticles are in said second domain.

34. The composite material as claimed in claim 33, wherein the material of said nanoparticles is inorganic or metal or a mixture of metal and inorganic.

35. The composite material as claimed in claim 34, wherein the inorganic nanoparticles is thermal stable.

36. The composite material as claimed in claim 34, wherein the material of said inorganic nanoparticles comprises at least one selected from the group consisting of TiO2, CdS, CdSe, GaAs, GaP, ZnO, Fe2O3, SnO2, SiC, InN, InGaN, GaN, PbS, Bi2S3, Cu—In—Ga—Se and Cu—In—Ga—S.

37. The composite material as claimed in claim 34, wherein the metal nanoparticles comprises at least one selected from the group consisting of gold, silver, and platinum.

38. The composite material as claimed in claim 33, wherein the connecting type between said second polymer chain and said nanoparticles is chemical bonding or physical bonding.

39. The composite material as claimed in claim 33, wherein the connecting type between said second polymer chain and said nanoparticles comprises at least one selected from the group consisting of covalent bond, coordination bond, van der Waals force, and hydrogen bond.

40. The composite material as claimed in claim 33, wherein said second polymer chain comprises at least one selected from the group consisting of poly(4-vinyl pyridine) (PVP), poly(2-vinyl pyridine), poly(vinyl alcohol), poly(acrylic acid) (PAA), poly(methylmethacrylate) (PMMA), poly(ethylene oxide) (PEO), polystyrene sulfonic acid (PSSA), poly hydroxyl styrene (PSOH), and poly(ethylene glycol) (PEG).

41. The composite material as claimed in claim 33, wherein the shape of said diblock copolymers is linear or comblike or starlike or dendritic.

42. The composite material as claimed in claim 33, wherein the shape of said first domain and said second domain are independently selected from the group consisting of substantially pillar-shaped, substantially laminate, substantially spiral, and substantially network-shaped.

43. The composite material as claimed in claim 33, wherein said composite material is membrane-shaped with a first surface and a second surface wherein said first surface is opposite to said second surface.

44. The composite material as claimed in claim 43, wherein said first domain provides a substantially linear first pathway from said first surface to said second surface, and said first pathway is used for hole traveling.

45. The composite material as claimed in claim 44, wherein the length of said first pathway is substantially equal to the thickness of said composite material.

46. The composite material as claimed in claim 43, wherein said second domain provides a substantially linear second pathway from said first surface to said second surface, and said second pathway is used for electron traveling.

47. The composite material as claimed in claim 46, wherein the length of the second pathway is substantially equal to the thickness of said composite material.

48. The composite material as claimed in claim 43, wherein said composite material is used as an active layer whose functions including light absorption, charge separation and charge transport of the photovoltaic device.

* * * * *